United States Patent [19]
Marcinkiewicz

[11] Patent Number: 6,001,673
[45] Date of Patent: Dec. 14, 1999

[54] METHODS FOR PACKAGING INTEGRATED CIRCUIT DEVICES INCLUDING CAVITIES ADJACENT ACTIVE REGIONS

[75] Inventor: Walter M. Marcinkiewicz, Apex, N.C.

[73] Assignee: Ericsson Inc., Research Triangle Park, N.C.

[21] Appl. No.: 09/248,546

[22] Filed: Feb. 11, 1999

[51] Int. Cl.⁶ ................................................... H01L 21/82
[52] U.S. Cl. .......................... 438/128; 438/118; 438/456
[58] Field of Search ..................... 438/118, 119, 438/128, 129, 406, 455, 456

[56] References Cited

U.S. PATENT DOCUMENTS

| | | | |
|---|---|---|---|
| 4,218,701 | 8/1980 | Shirasaki | 357/72 |
| 5,148,265 | 9/1992 | Khandros et al. | 357/80 |
| 5,524,339 | 6/1996 | Gorowitz et al. | 438/118 |
| 5,661,086 | 8/1997 | Nakashima et al. | 257/668 |
| 5,677,566 | 10/1997 | King et al. | 257/666 |
| 5,837,562 | 11/1998 | Cho et al. | 438/456 |
| 5,866,469 | 2/1999 | Hays | 438/456 |

FOREIGN PATENT DOCUMENTS

| | | |
|---|---|---|
| 4-305962 | 10/1992 | Japan . |
| 7-245356 | 9/1995 | Japan . |
| 7-321244 | 10/1995 | Japan . |

OTHER PUBLICATIONS

Crowley, Robert T, et al., *Chip–Size Packaging Developments, TechSearch International, Inc.*, pp. 101–109 (Aug. 1995).

*Primary Examiner*—Chandra Chaudhari
*Attorney, Agent, or Firm*—Myers Bigel Sibley & Sajovec

[57] ABSTRACT

A method for packaging an integrated circuit device includes forming a dielectric support layer on the surface of a substrate wherein the dielectric support layer includes an opening therein exposing at least a portion of an active region of the substrate. A protective layer is provided on the dielectric support layer opposite the substrate wherein the protective layer covers the exposed portion of the active region of the substrate thereby defining a cavity between the protective layer and the active region. More particularly, the step of forming the dielectric support layer can include forming a continuous dielectric layer on the surface of the substrate including the active region, and removing portions of the continuous dielectric layer from the active region to provide the opening of the dielectric support layer. Related structures are also discussed.

21 Claims, 3 Drawing Sheets

METHODS FOR PACKAGING INTEGRATED CIRCUIT DEVICES INCLUDING CAVITIES ADJACENT ACTIVE REGIONS

FIELD OF THE INVENTION

The present invention relates to the field of integrated circuits and more particularly to methods and structures for packaging integrated circuit devices.

BACKGROUND OF THE INVENTION

Integrated circuit devices are used in radio communications devices such as cellular radio telephones. In particular, integrated circuit (IC) devices including radio frequency (RF) circuitry fabricated using high speed semiconductor materials such as gallium arsenide (GaAs) and/or indium phosphide (InP) are commonly used.

These RF-IC devices are conventionally encapsulated in plastic packages with the RF circuitry being covered with plastic. The conventional plastic package, however, may add parasitic capacitance reducing the performance of the RF circuitry. In particular, the plastics used in these conventional packages may have dielectric constants of 4 or higher.

Accordingly, packages for RF-IC devices have been developed to remove the plastic from the RF circuitry. In particular, a package including a pre-molded support and a lid which are attached to the RF-IC device have been proposed. The pre-molded support is attached to the surface of the RF-IC device, and an opening in the pre-molded support exposes the RF circuitry. The lid is attached to the pre-molded support to cover this opening.

This package, however, may be undesirably complicated and expensive because the pre-molded support and lid are separately formed and then attached to individual RF-IC devices. Moreover, the pre-molded support and lid may add undesired height to the RF-IC device.

Accordingly, there continues to exist a need in the art for improved integrated circuit packages and methods.

SUMMARY OF THE INVENTION

It is therefore an object of the present invention to provide improved methods for forming integrated circuit packages and related structures.

It is another object of the present invention to provide methods for forming integrated circuit packages having improved performance and related structures.

It is still another object of the present invention to provide methods for forming integrated circuit packages having improved efficiency and related structures.

These and other objects are provided according to the present invention by forming a dielectric support layer on the surface of the substrate wherein the dielectric support layer includes an opening therein exposing at least a portion of an active region of the substrate, and providing a protective layer on the dielectric support layer covering the exposed portion of the active region thereby defining a cavity between the protective layer and the active region. The cavity can provide improved performance for radio frequency circuitry on the substrate by reducing parasitic capacitances. In addition, the cost and complexity of fabricating and attaching a separate pre-molded part can be reduced by forming the dielectric support layer on the substrate.

More particularly, the step of forming the dielectric support layer can include forming a continuous dielectric layer on the surface of the substrate including the active region, and removing portions of the continuous dielectric layer from the active region to provide the opening of the dielectric support layer. The dielectric support layer can thus be formed on the substrate using photolithographic techniques. Moreover, the dielectric support layer can be simultaneously formed on a plurality of integrated circuit devices on a common wafer.

The dielectric support layer can be a layer of a material having a dielectric constant in the range of 0 to 4 further reducing parasitic capacitances. More particularly, the dielectric support layer can be formed from a material such as polyimide, polyester, benzocyclobutane, teflon, silicone, epoxies, thermoplastics, or thermosetting resins. The protective layer can include a dielectric tape layer and an adhesive layer between the dielectric tape layer and the dielectric support layer. Accordingly, the protective layer can be separately formed using techniques similar to those used in tape automated bonding.

In addition, the substrate can include an input/output pad on the surface thereof, and the input/output pad is preferably exposed by the dielectric support layer. Furthermore, the dielectric support layer can surround the exposed input/output pad. Moreover, the protective layer can include a conductive trace extending therefrom, and the conductive trace of the protective layer can be mated with the input/output pad. A solder bump can also be provided on the protective layer opposite the substrate wherein the solder bump is electrically coupled with the at least one conductive trace. The solder bump and conductive trace can thus provide electrical and mechanical interconnection between the integrated circuit device and a next level substrate such as a printed circuit board.

The active region of the substrate can include radio frequency circuitry, mixed signal circuitry, high speed digital circuitry, or high speed analog circuitry, and the performance of the circuitry can be increased by providing the cavity adjacent thereto. As discussed above, the cavity can reduce parasitic capacitances for circuitry in the active region adjacent the cavity. In addition, the substrate can include a high speed semiconductor material such as gallium arsenide (GaAs) or indium phosphide (InP). The substrate can also include materials such as silicon (Si) or silicon germanium (SiGe).

DETAILED DESCRIPTION

Figure 1:
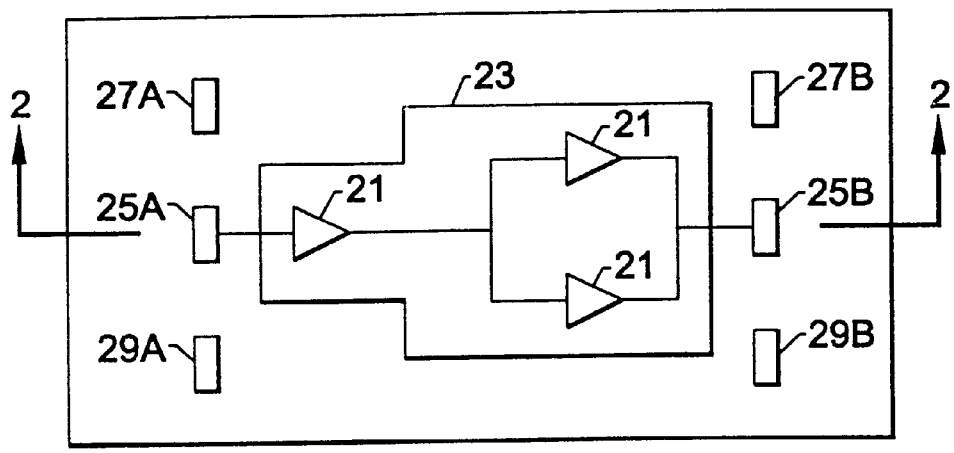
FIG. 1 is a top view of an integrated circuit device on which an integrated circuit package can be provided according to the present invention.

The present invention will now be described more fully hereinafter with reference to the accompanying drawings, in which preferred embodiments of the invention are shown.

This invention disclosure may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of the layers and regions are exaggerated for clarity. It will also be understood that when a layer is referred to as being "on" another layer or substrate, it can be directly on the other layer or substrate, or intervening layers may also be present.

FIG. 1 is a top view of an integrated circuit (IC) device including radio frequency circuitry (RF) 21 on an active region 23 of a substrate. This IC device also includes input/output pads 25A–B, 27A–B, and 29A–B. This integrated circuit device can be used in a radio communications device such as a cellular radio telephone. Steps of a method for forming a package for the IC device of FIG. 1 are illustrated in FIGS. 2A–E, wherein each of the cross sectional views are taken along section line 2—2 of FIG. 1.

Figure 2A:
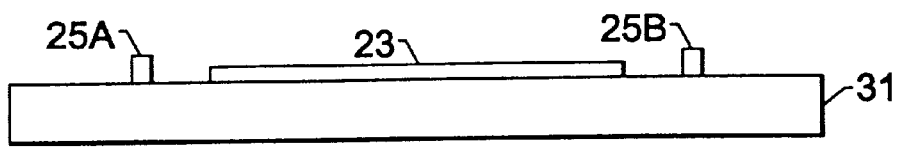
FIGS. 2A–2E are cross sectional views illustrating steps of a method of forming an integrated circuit package according to the present invention wherein the cross sections of FIGS. 2A–2E are taken along section line 2 of FIG. 1.

As shown in FIG. 2A, the active region 23 which is connected to the input/output pads 25A–B are formed on the substrate 31. In particular, the substrate can comprise a high speed semiconductor material such as gallium arsenide (GaAs) or indium phosphide (InP). The substrate can alternately comprise silicon (Si) or silicon germanium (SiGe). While the active region 23 is shown as being raised with respect to the substrate 31 surface, this is done for purposes of illustration, and those having skill in the art will understand that portions of the active region 23 can be raised with respect to the substrate 31 surface, that portions of the active region 23 can be flush with respect to the substrate 31 surface, and/or portions of the active region 23 can be beneath the substrate 31 surface.

Figure 2B:
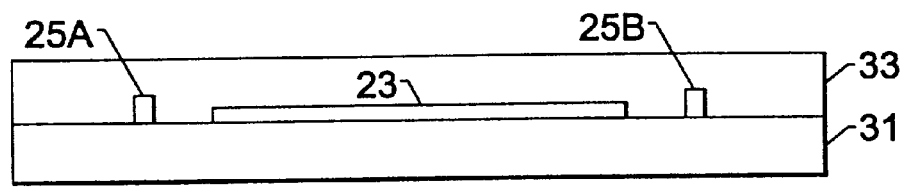

A dielectric layer 33 is then formed on the surface of the substrate 31 including the active region 23 and the input/output pads 25A–B, as shown in FIG. 2B. The dielectric layer 33 preferably has a relatively low dielectric constant, and the dielectric constant of the dielectric layer 33 is preferably 4 or lower. In particular, the dielectric layer 33 can be a layer of a material such as polyimide, polyester, benzocyclobutane, or teflon with respective dielectric constants of approximately 3, 4, 2.7, and 1.8. The dielectric layer 33 can also be a layer of a material such as a silicone gel, an epoxy, a thermoplastic, or a thermosetting resin.

The dielectric layer 33 can be formed on the surface of the substrate 31 using any of a variety of techniques known to those having skill in the art. For example, the dielectric layer 33 can be spun on the substrate 31, or the dielectric layer 33 can be deposited on the substrate 31. Moreover, the dielectric layer 33 can be simultaneously formed on a plurality of integrated circuit devices on a common wafer before dicing the wafer into separate integrated circuit devices. Accordingly, the dielectric layer can be efficiently formed on a plurality of integrated circuit devices in a single step.

Figure 2C:
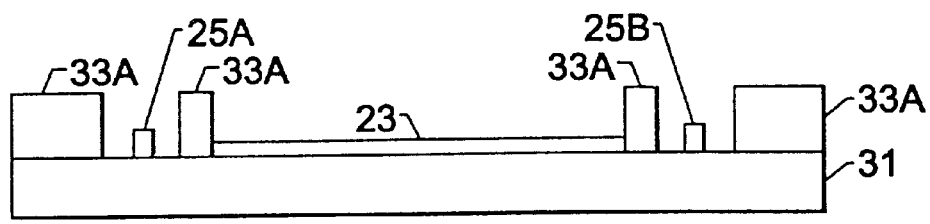

The dielectric layer 33 is then patterned to provide a dielectric support layer 33A as shown in FIG. 2C. In particular, portions of the dielectric layer 33 are removed so that the active region 23 including the RF circuitry 21 and the input/output pads 25A–B, 27A–B, and 29A–B are exposed by the dielectric support layer 33A. While not shown explicitly, other active regions of the substrate may be covered by the dielectric support layer 33A.

The dielectric layer can be patterned using known photolithographic masking and etching steps. For example, a photoresist mask can be formed on the dielectric layer 33, and exposed portions of the dielectric layer can be etched (removed) using either a dry plasma or a wet etch. Alternately, a hard mask of a metal such as aluminum can be used. The mask layer can then be removed after patterning the dielectric layer 33 leaving the dielectric support layer 33A as shown in FIG. 2C.

The dielectric layer 33 can alternately be patterned directly without the use of a separate mask layer. In particular, the dielectric layer 33 can be a photodefinable material that can be selectively exposed to radiation and developed leaving the dielectric support layer 33A as shown in FIG. 2C. For example, polyimide, polyester, and benzocyclobutane can be photodefinable.

As with the formation of the dielectric layer 33 on a plurality of integrated circuit devices on a common wafer, the dielectric layer 33 can be patterned simultaneously on a plurality of integrated circuit devices on a common wafer. Accordingly, the dielectric layer 33 can be efficiently formed and patterned on a large number of integrated circuit devices on a common substrate.

Figure 2D:
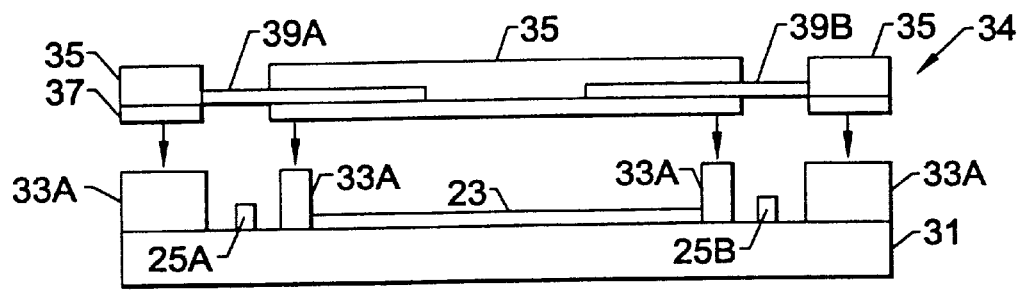

A separately formed protective layer 34 is aligned with the integrated circuit device as shown in FIG. 2D. This protective layer includes a dielectric tape 35, an adhesive layer 37, and conductive traces 39A and 39B. As shown, the conductive traces 39A and 39B correspond to the input/output pads 25A and 25B. The protective layer can be formed as a tape using techniques similar to techniques used in tape automated bonding with the addition of the adhesive layer. Accordingly, a plurality of protective layers can be formed on a common tape.

For example, the protective layer can be formed by providing the dielectric tape layer, and forming the conductive traces 39A and 39B thereon. The adhesive layer 37 can then be spray coated or spun on the dielectric tape layer. The dielectric tape layer and the adhesive layer 37 can then be patterned to exposed portions of the conductive traces 39A and 39B to be bonded with respective input/output pads 25A and 25B, and to provide the dielectric tape 35 shown in FIG. 2D.

Figure 2E:
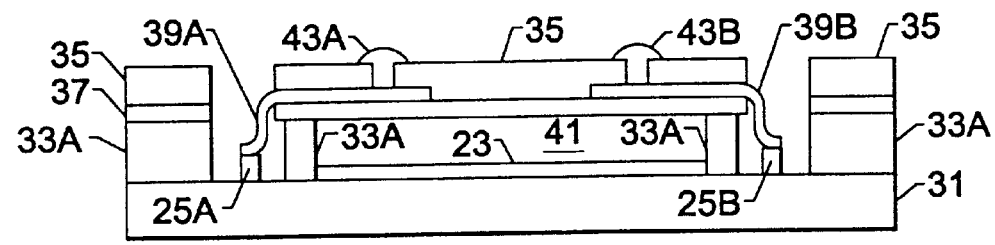

The protective layer 34 is attached to the corresponding portions of the dielectric support layer 33A as shown in FIG. 2E. The protective layer can be attached using techniques similar to those used in tape automated bonding. The adhesive layer 37 provides a bond between the protective layer 34 and the dielectric support layer 33A. In addition, a baking and/or curing step can be used to increase adhesion between the protective layer and the integrated circuit device. The baking and/or curing step can alternately be performed at a later point in processing. Accordingly, a cavity 41 is provided adjacent the active region 23 including the radio frequency circuitry 21. Alternately, the protective layer 34 can be bonded to the dielectric support layer 33A without the adhesive layer. For example, reflow characteristics of the dielectric support layer 33A and/or the dielectric tape 35 can provide adhesion with the addition of a curing step.

As also shown in FIG. 2E, the conductive traces 39A and 39B are bonded with the respective input/output pads 25A and 25B. The conductive traces can be bonded with the input/output pads at the same time the protective layer is attached to the dielectric support layer 33A. Alternately, the conductive traces can be bonded after attaching the protective layer. In particular, the conductive traces can be bonded using a wirebonding tool such as a thermosonic wirebonding tool used in tape automated bonding.

Once the protective layer is attached to the integrated circuit device, solder bumps 43A and 43B can be formed on the dielectric tape or attached thereto. As shown, contact holes through the dielectric tape 35 provide electrical coupling between the solder bumps 43 and respective conductive traces 39A and 39B. The solder bumps provide electrical and mechanical connection between the integrated circuit device and the next level substrate such as a printed circuit board. Alternately, the solder bumps can be formed on the protective layer 34 prior to attachment with the integrated circuit device.

Figure 3:
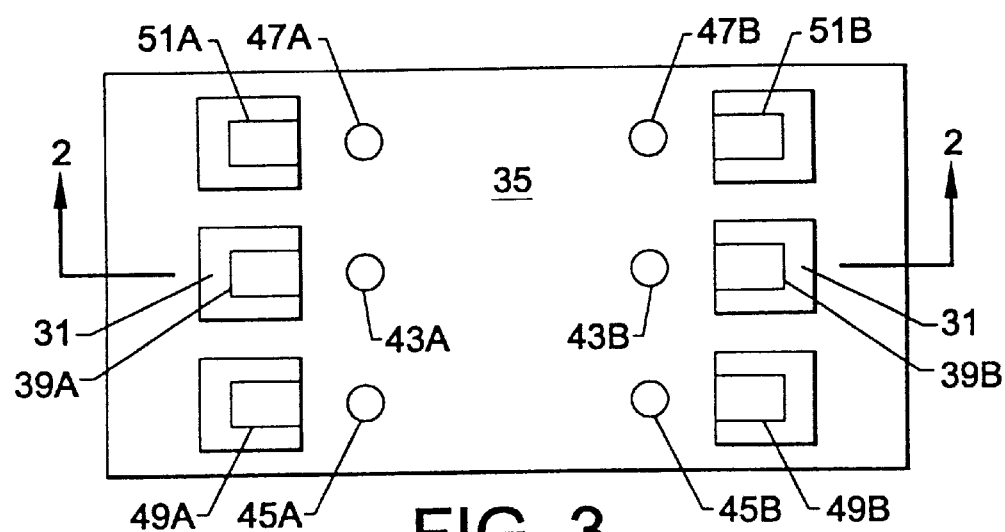
FIG. 3 is a top view of the completed integrated circuit package of FIG. 2E.

A top view of the completed structure of FIG. 2E is shown in FIG. 3. FIG. 3 shows that the solder bumps 43A and 43B on the dielectric tape layer 35, as well as the openings in the dielectric tape layer exposing portions of the conductive traces 39A and 39B. These openings also expose portions of the substrate 31 adjacent the conductive traces 39A and 39B. In addition to the conductive traces 39A and 39B and the solder bumps 43A and 43B shown in FIG. 2E, FIG. 3 also shows additional solder bumps 45A, 45B, 47A, and 47B and corresponding conductive traces 49A, 49B, 51A, and 51B. The protective layer of FIG. 3 thus provides a fan-in structure wherein each input/output pad is between its respective solder bump and the edge of the device.

Figure 4A:
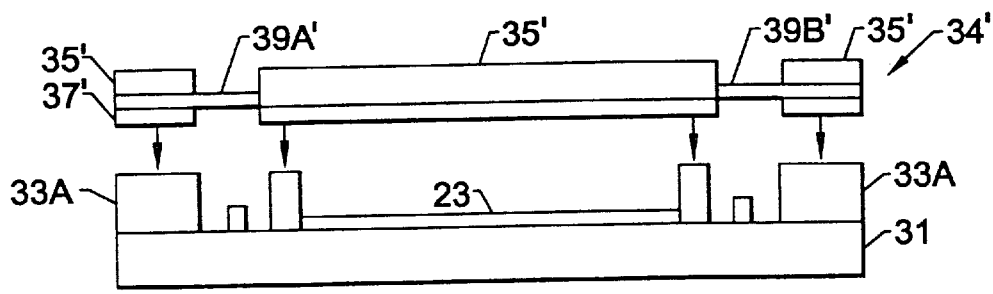
FIGS. 4A–4B are cross sectional views illustrating steps of an alternate method of forming an integrated circuit package according to the present invention.
Figure 4B:
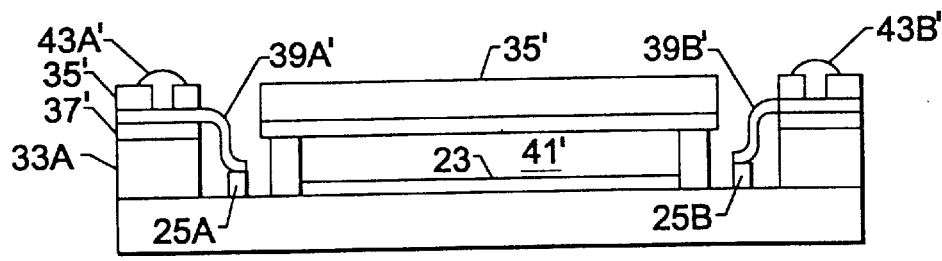
Figure 5:
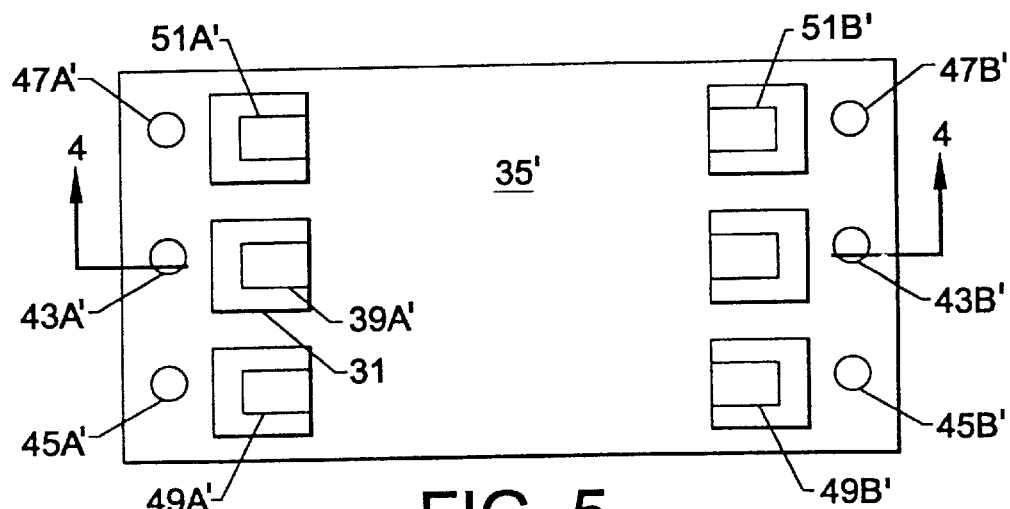
FIG. 5 is a top view of the completed integrated circuit package of FIG. 4B.

Alternately, a fan-out structure can be provided as shown in FIGS. 4A–B and 5. FIGS. 4A–B and FIG. 5 respectively correspond to FIGS. 2D–E and FIG. 3 as discussed above. In particular, the steps of forming the integrated circuit device including the substrate 31, the active region 23, the input/output pads 25A and 25B, and the dielectric support layer 33A are the same as the steps used to form the integrated circuit device of FIG. 2D. The protective layer 34' including the dielectric tape layer 35', the adhesive layer 37', and the conductive traces 39A' and 39B', however, provides a fan-out structure. In particular, the solder bumps 43A' and 43B' are between the respective input/output pads 25A and 25B and the edge of the integrated circuit device. As discussed above with reference to FIGS. 2D and 2E, the protective layer can be bonded to the dielectric support layer without the adhesive layer. The top view of FIG. 5 shows the additional solder bumps 45A', 45B', 47A', and 47B' and the additional conductive traces 49A', 49B', 51A', and 51B'. Furthermore, a package including both the fan-in and the fan-out structures can be provided according to the present invention.

The methods and structures of the present invention thus provide a cavity adjacent the active region of the integrated circuit device including the radio frequency circuitry. Performance of the radio frequency circuitry can thus be improved. In addition, by forming the dielectric layer on the integrated circuit device and patterning the dielectric layer on the integrated circuit device, there is no need for a pre-molded part to be attached to the substrate. The cost and complexity of providing the package can thus be reduced, and the height of the completed structure can also be reduced. In particular, a dielectric layer having a thickness on the order of microns can be formed and patterned, as opposed to a pre-molded part which may have a thickness on the order of hundredths of mils. Furthermore, the patterned dielectric support layer can be formed simultaneously on a plurality of integrated circuit devices on a common wafer further reducing cost and complexity.

In the drawings and specification, there have been disclosed typical preferred embodiments of the invention, and although specific terms are employed, they are used in a generic sense only and not for purposes of limitation, the scope of the invention being set forth in the following claims.

That which is claimed is:

1. A method for packaging an integrated circuit device comprising a substrate including an active region on a surface thereof, the method comprising the steps of:

forming a dielectric support layer on the surface of the substrate wherein the dielectric support layer includes an opening therein exposing at least a portion of the active region, wherein the step of forming the dielectric support layer comprises, forming a continuous dielectric layer on the surface of the substrate including the active region, and removing portions of the continuous dielectric layer from the active region to provide the opening of the dielectric support layer; and providing a protective layer on the dielectric support layer opposite the substrate wherein the protective layer covers the exposed portion of the active region of the substrate thereby defining a cavity between the protective layer and the active region.

2. A method according to claim 1 wherein the dielectric support layer comprises a material having a dielectric constant in the range of 0 to 4.

3. A method according to claim 1 wherein the dielectric support layer comprises a material chosen from the group consisting of polyimide, polyester, benzocyclobutane, teflon, silicone, epoxies, thermoplastics, and thermosetting materials.

4. A method according to claim 1 wherein the protective layer comprises a dielectric tape layer and an adhesive layer between the dielectric tape layer and the dielectric support layer.

5. A method according to claim 1 wherein the substrate includes at least one input/output pad on the surface thereof, and wherein the at least one input/output pad is exposed by the dielectric support layer.

6. A method according to claim 5 wherein the dielectric support layer surrounds the at least one input/output pad.

7. A method according to claim 5 wherein the protective layer includes at least one conductive trace extending therefrom, the method further comprising the step of:

mating the at least one conductive trace of the protective layer with the at least one input/output pad.

8. A method according to claim 7 wherein the protective layer further includes at least one solder bump thereon opposite the substrate wherein the at least one solder bump is electrically coupled with the at least one conductive trace.

9. A method according to claim 1 wherein the exposed portion of the active region of the substrate includes at least one of a radio frequency electronic device, a mixed signal device, a high speed digital signal device, and an analog signal device.

10. A method according to claim 1 wherein the substrate comprises a high speed semiconductor material.

11. A method according to claim 10 wherein the high speed semiconductor material is chosen from the group consisting of gallium arsenide (GaAs), indium phosphide (InP), silicon (Si), and silicon germanium (SiGe).

12. A method for packaging an integrated circuit device comprising a substrate including an active region and at least one input/output pad on a surface thereof, the method comprising the steps of:

forming a dielectric support layer on the surface of the substrate wherein the dielectric support layer includes an opening therein exposing at least a portion of the active region and wherein the at least one input/output pad is exposed by the dielectric support layer;

providing a protective layer on the dielectric support layer opposite the substrate wherein the protective layer covers the exposed portion of the active region of the substrate thereby defining a cavity between the protective layer and the active region wherein the protective layer includes at least one conductive trace extending therefrom; and mating the at least one conductive trace of the protective layer with the at least one input/output pad.

13. A method according to claim 12 wherein the step of forming the dielectric support layer comprises:

forming a continuous dielectric layer on the surface of the substrate including the active region; and removing portions of the continuous dielectric layer from the active region to provide the opening of the dielectric support layer and to expose the at least one input/output pad.

14. A method according to claim 12 wherein the dielectric support layer comprises a material having a dielectric constant in the range of 0 to 4.

15. A method according to claim 12 wherein the dielectric support layer comprises a material chosen from the group consisting of polyimide, polyester, benzocyclobutane, teflon, silicone, epoxies, thermoplastics, and thermosetting resins.

16. A method according to claim 12 wherein the protective layer comprises a dielectric tape layer and an adhesive layer between the dielectric tape layer and the dielectric support layer.

17. A method according to claim 12 wherein the dielectric support layer surrounds the at least one input/output pad.

18. A method according to claim 12 wherein the protective layer further includes at least one solder bump thereon opposite the substrate wherein the at least one solder bump is electrically coupled with the at least one conductive trace.

19. A method according to claim 12 wherein the exposed portion of the active region of the substrate includes at least one of a radio frequency electronic device, a mixed signal device, a high speed digital device, and an analog signal device.

20. A method according to claim 12 wherein the substrate comprises a high speed semiconductor material.

21. A method according to claim 20 wherein the high speed semiconductor material is chosen from the group consisting of gallium arsenide (GaAs), indium phosphide (InP), silicon (Si), and silicon germanium (SiGe).

* * * * *